United States Patent
Coxe, III et al.

(10) Patent No.: US 10,925,187 B1
(45) Date of Patent: Feb. 16, 2021

(54) REMOTE HEAT EXCHANGER ARM FOR DIRECT CONTACT LIQUID COOLING FOR RACK MOUNTED EQUIPMENT

(71) Applicant: DELL PRODUCTS, LP, Round Rock, TX (US)

(72) Inventors: William K. Coxe, III, Round Rock, TX (US); Corey D. Hartman, Hutto, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/557,111

(22) Filed: Aug. 30, 2019

(51) Int. Cl.
*H05K 7/20* (2006.01)

(52) U.S. Cl.
CPC ..... *H05K 7/20781* (2013.01); *H05K 7/20145* (2013.01); *H05K 7/20209* (2013.01); *H05K 7/20272* (2013.01); *H05K 7/20736* (2013.01)

(58) Field of Classification Search
CPC ........... H05K 7/20781; H05K 7/20209; H05K 7/20272; H05K 7/20145; H05K 7/20736; H05K 7/20772; G06F 1/20; G06F 1/203; G06F 1/206
USPC ........................ 361/688–689, 696–703, 720; 165/80.4–80.5, 104.33, 908
See application file for complete search history.

(56) References Cited

U.S. PATENT DOCUMENTS

| | | | |
|---|---|---|---|
| 6,997,247 B2 * | 2/2006 | Malone | F28D 1/0477 165/150 |
| 7,149,084 B2 * | 12/2006 | Matsushima | H01L 23/473 361/699 |
| 7,252,139 B2 * | 8/2007 | Novotny | F25D 19/00 165/80.2 |
| 7,280,358 B2 * | 10/2007 | Malone | G06F 1/20 165/104.33 |
| 7,318,322 B2 | 1/2008 | Ota et al. | |
| 7,372,698 B1 * | 5/2008 | Tilton | H05K 7/20772 165/104.33 |
| 7,907,398 B2 | 3/2011 | Hrehor, Jr. et al. | |
| 7,990,709 B2 * | 8/2011 | Campbell | H05K 7/2079 361/696 |
| 8,000,101 B2 * | 8/2011 | Searby | G06F 1/20 361/696 |
| 8,305,754 B2 | 11/2012 | Wu et al. | |
| 8,374,731 B1 * | 2/2013 | Sullivan | G11B 33/142 700/299 |
| 8,405,975 B2 | 3/2013 | Helberg et al. | |
| 8,670,241 B2 | 3/2014 | Sherrod et al. | |
| 8,929,080 B2 * | 1/2015 | Campbell | H05K 7/20236 361/719 |
| 9,089,078 B2 * | 7/2015 | Branton | H05K 7/20754 |
| 9,215,832 B2 * | 12/2015 | Chang | H05K 7/20781 |
| 9,462,728 B2 | 10/2016 | Demange et al. | |
| 9,575,521 B1 | 2/2017 | North et al. | |

(Continued)

*Primary Examiner* — Stephen S Sul
(74) *Attorney, Agent, or Firm* — Larson Newman, LLP (57) ABSTRACT

An information handling system includes a server rack, a processing system, and a liquid cooling heat exchanger module. The processing system is configured to be installed into at least one rack unit of the server rack, and includes a component configured to be cooled by a liquid cooling cold plate. The heat exchanger module is affixed to the server rack within a same rack unit as the processing system, and is configured to provide chilled cooling liquid to cool the cold plate, and to no other equipment in the server rack.

18 Claims, 8 Drawing Sheets

(56) References Cited

U.S. PATENT DOCUMENTS

| | | | |
|---|---|---|---|
| 10,136,554 B2 * | 11/2018 | Chainer | G05D 23/1919 |
| 10,201,115 B2 | 2/2019 | Johnson et al. | |
| 10,477,725 B2 * | 11/2019 | Chen | H05K 7/20263 |
| 2004/0008433 A1 | 1/2004 | Margeson | |
| 2004/0057211 A1 | 3/2004 | Kondo et al. | |
| 2005/0109490 A1 * | 5/2005 | Harmon | F24H 4/04 |
| | | | 165/133 |
| 2005/0231913 A1 * | 10/2005 | Malone | H05K 7/20727 |
| | | | 361/698 |
| 2006/0139880 A1 * | 6/2006 | Tate | G06F 1/20 |
| | | | 361/697 |
| 2009/0265045 A1 | 10/2009 | Coxe, III | |
| 2010/0085712 A1 | 4/2010 | Hrehor, Jr. et al. | |
| 2012/0216729 A1 | 8/2012 | Baldrey et al. | |
| 2013/0019614 A1 * | 1/2013 | Campbell | H05K 7/20236 |
| | | | 62/62 |
| 2014/0268547 A1 * | 9/2014 | Kondo | G06F 1/206 |
| | | | 361/679.47 |
| 2015/0062803 A1 * | 3/2015 | Lin | H05K 7/20727 |
| | | | 361/679.47 |
| 2016/0153595 A1 * | 6/2016 | Arvelo | F16L 21/002 |
| | | | 285/332 |
| 2016/0341342 A1 * | 11/2016 | Arvelo | H05K 7/20272 |
| 2017/0082222 A1 * | 3/2017 | Buvid | H05K 7/20254 |
| 2017/0127575 A1 | 5/2017 | Lunsman et al. | |
| 2017/0257980 A1 * | 9/2017 | Fukunaga | H01R 13/005 |
| 2018/0324984 A1 * | 11/2018 | Marroquin | H05K 7/20772 |

* cited by examiner

REMOTE HEAT EXCHANGER ARM FOR DIRECT CONTACT LIQUID COOLING FOR RACK MOUNTED EQUIPMENT

FIELD OF THE DISCLOSURE

The present disclosure generally relates to information handling systems, and more particularly relates to a remote heat exchanger arm for direct contact liquid cooling for rack mounted equipment.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system may include a processing system installed into at least one rack unit of a server rack, and may include a component configured to be cooled by a liquid cooling cold plate. A liquid cooling heat exchanger module may be affixed to the server rack within a same rack unit as the processing system, and may be configured to provide chilled cooling liquid to cool the cold plate, and to no other equipment in the server rack.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

A constant challenge in data centers is to keep the data center equipment cooled sufficiently in order to be operated at the equipment's highest performance settings. Solutions to equipment cooling have historically been directed to fan cooling, carefully directing the cooling air over the critical components of the data center equipment, and providing larger heatsinks on the critical components. However, as the performance and power levels of the equipment has increased, the ability to sufficiently maintain lower component temperatures using forced air over increasingly large heatsinks has become an increasing challenge. One solution has been to provide a liquid cooling solution for the components of the data center equipment, with centralized liquid cooling infrastructure at the server rack or data center level. This solution presents different challenges in the routing and distribution of the cooling liquid to the components on the individual elements of data center equipment. Further, it is not uncommon for particular data centers to forbid the use of centralized liquid cooling solutions due to the increased cost and complexity in supporting the data center.

Figure 1:
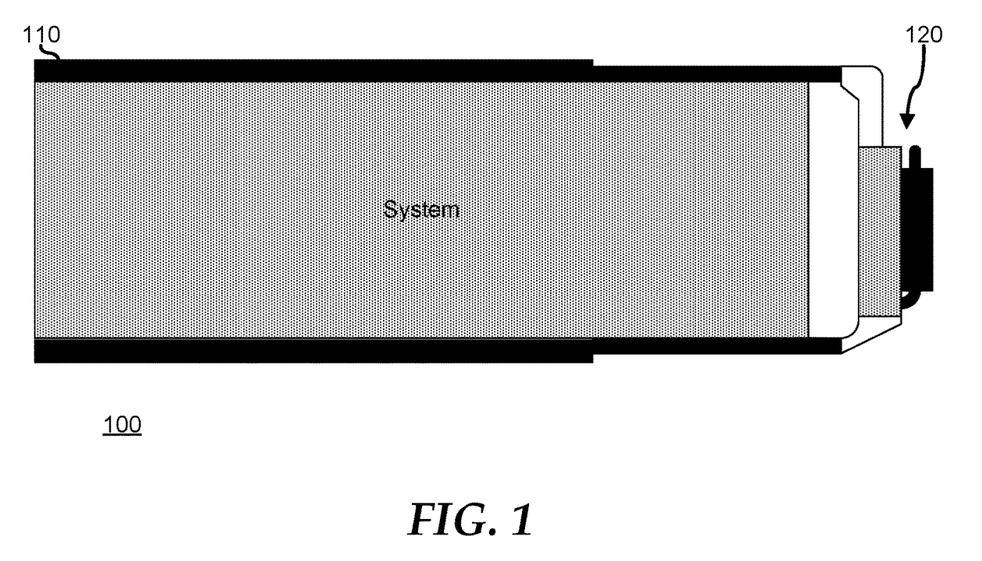
FIG. 1 is a top view of an information handling system according to at least one embodiment of the present disclosure.

FIG. 1 illustrates an information handling system 100. Information handling system 100 represents a rack-mountable element that is installable into a standard 19-inch server rack or cabinet, or into any other non-standard server rack or cabinet. For example, information handling system 100 and the associated server rack may each be in conformance with an Electronic Industries Alliance EIA-310-D standard, a Consumer Electronics Association CEA-310-E standard, an International Electrotechnical Commission IEC 60297 standard, or the like. As such, information handling system 100 will be understood to be have a height that is specified in a number of "rack units" (U), such as 1U-equipment, 2U-equipemnt, or another number of rack units (U).

Information handling system 100 includes a processing system 110 and a liquid cooling heat exchanger module 120. Processing system 110 represents an element of data center equipment, such as a stand-alone or blade server, storage server, network switching and routing equipment, power supply, or other equipment as may typically be utilized in a data center for providing the data processing functions of the data center. Processing system 110 is characterized by the fact that one or more element of the processing system presents a particularly heavy thermal load, and thus presents a challenge to the cooling system of the processing system. Heat exchanger module 120 represents a liquid cooling solution that is dedicated to the use of processing system 110, and that is sized to conform with the rack-mountable nature of information handling system 100. As such, heat exchanger module 120 provides a liquid cooling solution that does not violate a data center's restrictions on the use of centralized liquid cooling solutions, because the liquid cooling infrastructure is limited to the confines of information handling system 100. Further, heat exchanger module 120 fits within the dimensions of the server rack, inhabiting a location that may also be typically utilized by cable management arms, or other equipment at a back side of the server rack. In a particular embodiment, heat exchanger module 120 may be configured to be attached to a mounting bracket of information handling system 100, such as to rack sliding rails of the information handling system, as shown and described in FIG. 3, below. In another embodiment, heat exchanger module 120 may be configured to be attached to a hinge that is affixed to the server rack, as shown and described in FIG. 4, below.

Figure 2:
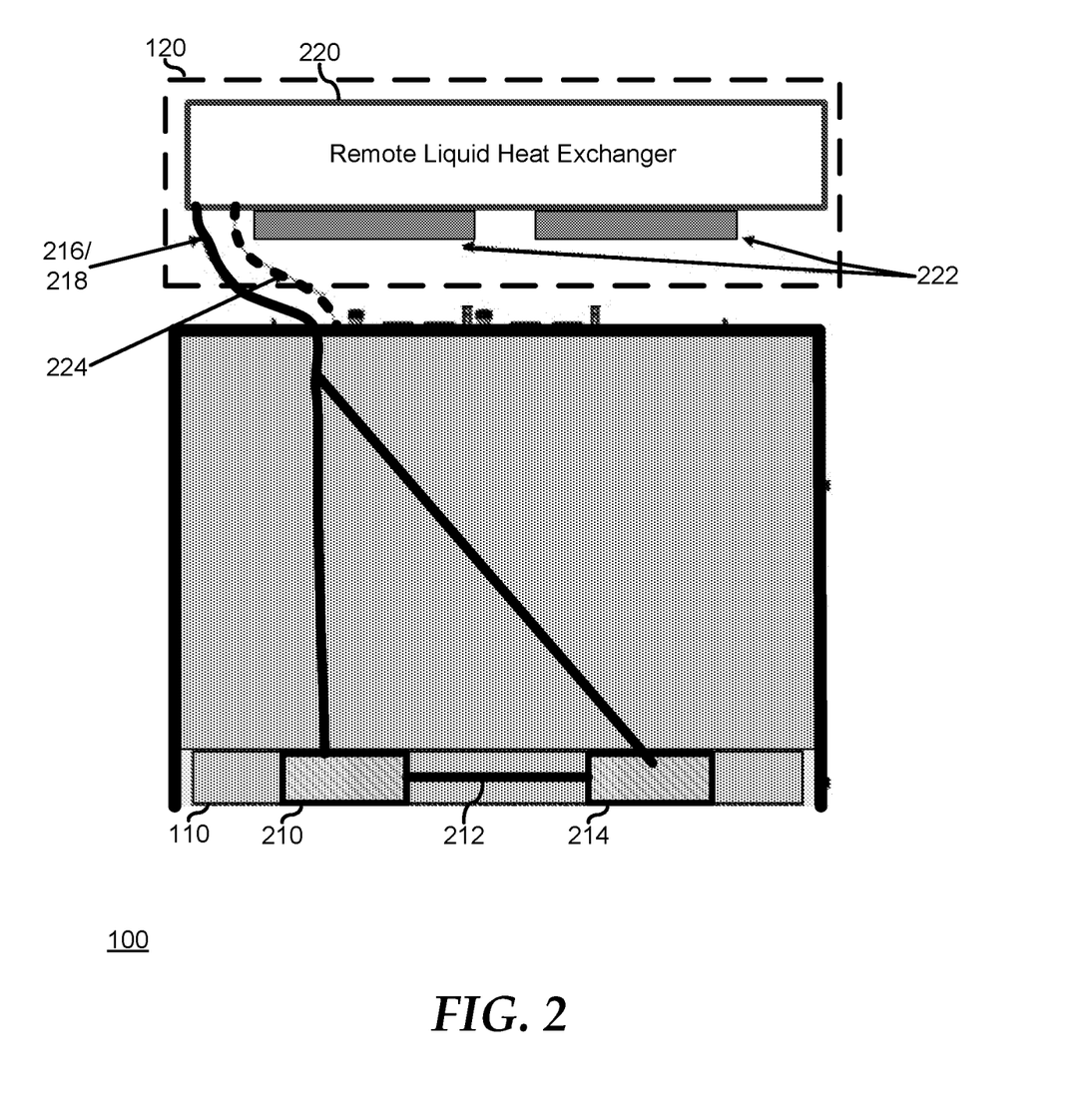
FIG. 2 is a detailed top view of a liquid cooling heat exchanger module of the information handling system of FIG. 1.

FIG. 2 illustrates a detailed view of information handling system 100, processing system 110, and heat exchanger module 120. In particular, processing system 110 includes elements that, because they present a particularly heavy thermal load on the processing system, are cooled with liquid cooling cold plates 210 and 214, also referred to as cold plates, that are connected to form a liquid cooling circuit with a remote liquid heat exchanger 220 of heat exchanger module 120 to transfer the heat from the elements to the heat exchanger module. Fans 222 of heat exchanger module 120 provide airflow to cool heat exchanger 220. In particular, a first cold plate 210 is affixed to the surface of a first high-heat element of processing system 110 to transfer heat from the first element to a cooling liquid that passes through the first cold plate, and a second cold plate 214 is affixed to the surface of a second high-heat element of the processing system. Specifically, cold plate 210 is connected to receive chilled cooling liquid from an input coolant line 216. An output of the first cold plate 210 is connected to provide the heated cooling liquid to cold plate 214 via an intermediate coolant line 212. An output of the second cold plate 214 is connected to provide the twice heated cooling liquid to an output coolant line 218. Coolant lines 216 and 218 are routed within processing system 110 to a back end of the processing system to be connected to heat exchanger module 120. Coolant lines 216 and 218 may have tubing connectors at the rear wall of processing system 110, with separate tubing elements connecting between processing system 110 and heat exchanger module 220. Fans 222 are connected via cable 224 to receive power and/or control signals from processing system 110. Liquid cooling within a processing system, the details of providing liquid cooling for high-heat elements within a processing system, and of connecting and routing of coolant lines is known in the art, and will not be further described herein except as needed to illuminate the present disclosure.

In operation, heat exchanger module 120 operates to provide chilled cooling liquid to input coolant line 216 to cool cold plates 210 and 214, and to receive the twice heated cooling liquid from coolant line 218 from the cold plates. Heat exchanger 220 operates to receive the heated cooling liquid from coolant line 218, to remove the heat from the cooling liquid, and to provide the cooled cooling liquid to coolant line 216. Fans 222 operate to pass cooled air over heat exchanger 220 to cool the cooling liquid. It will be understood that a liquid cooling system as described herein will include other elements, such as coolant pumps, coolant reservoirs, temperature sensors and the like, as may be known in the art. Such elements will not be further described herein, except as needed to illustrate the present embodiments.

Figure 3:
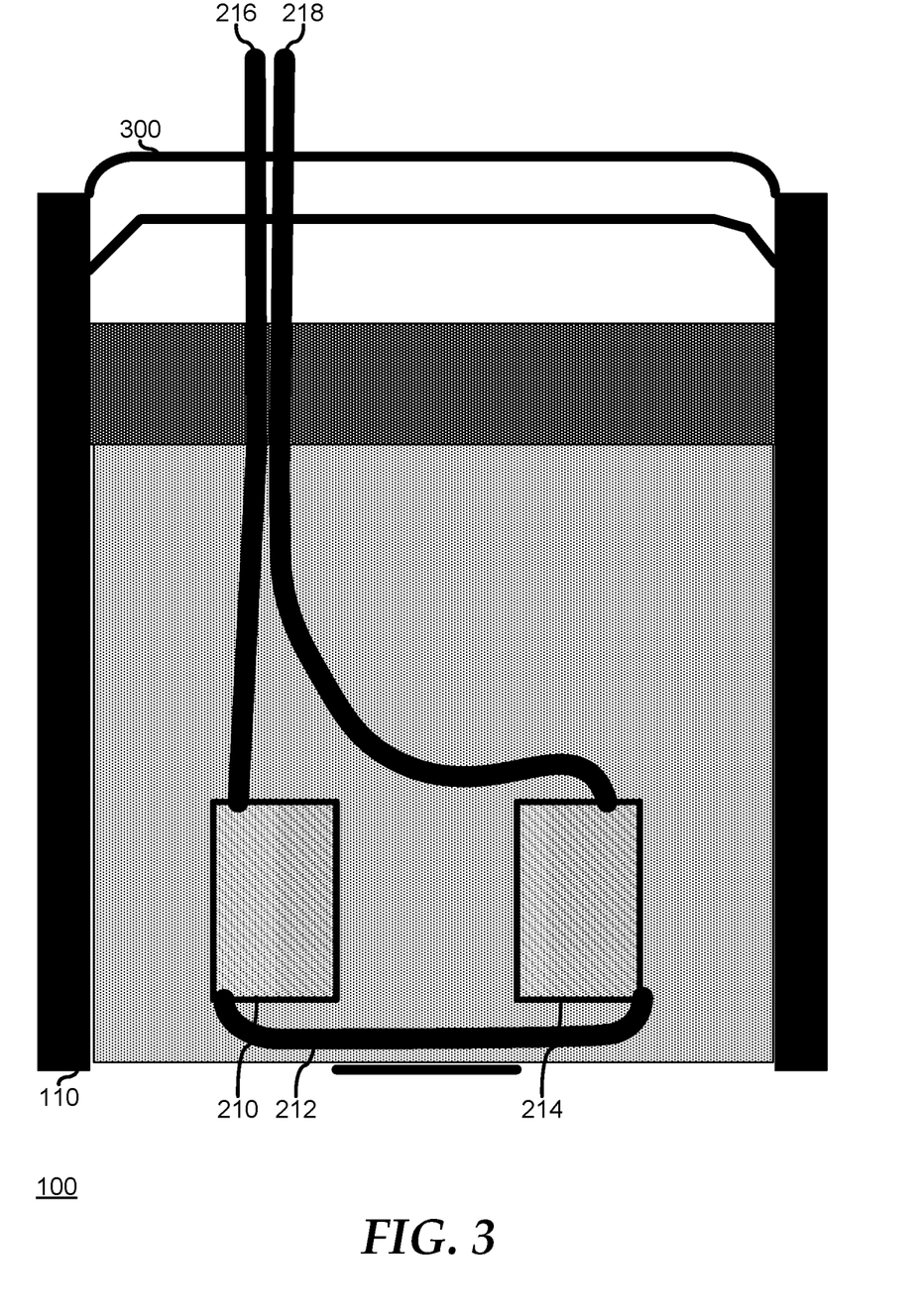
FIG. 3 is a detailed top view of the information handling system of FIG. 1.

In a particular embodiment, illustrated in FIG. 3, heat exchanger module 120 is configured to be attached to a mounting bracket 300 attached to information handling system 100. Here, heat exchanger module 120 (not illustrated in FIG. 3) is rigidly attached to mounting bracket 300 such that, as information handling system 100 is installed into or removed from a server rack, the heat exchanger module moves with the whole of the information handling system. As such, information handling system 100 can be provided from a manufacturer as an integrated whole that provides the functionality of the associated processing system 110, along with the liquid cooling system provided by heat exchanger module 120. It will be understood that, as illustrated with respect to FIG. 3, a heat exchanger module may be configured to be attached to a mounting bracket of the associated information handling system, to a set of rack sliding rails affixed to the side of the information handling system, or to another member affixed to the information handling system, such that the heat exchanger module moves as a unit with the associated information handling system.

Figure 4:
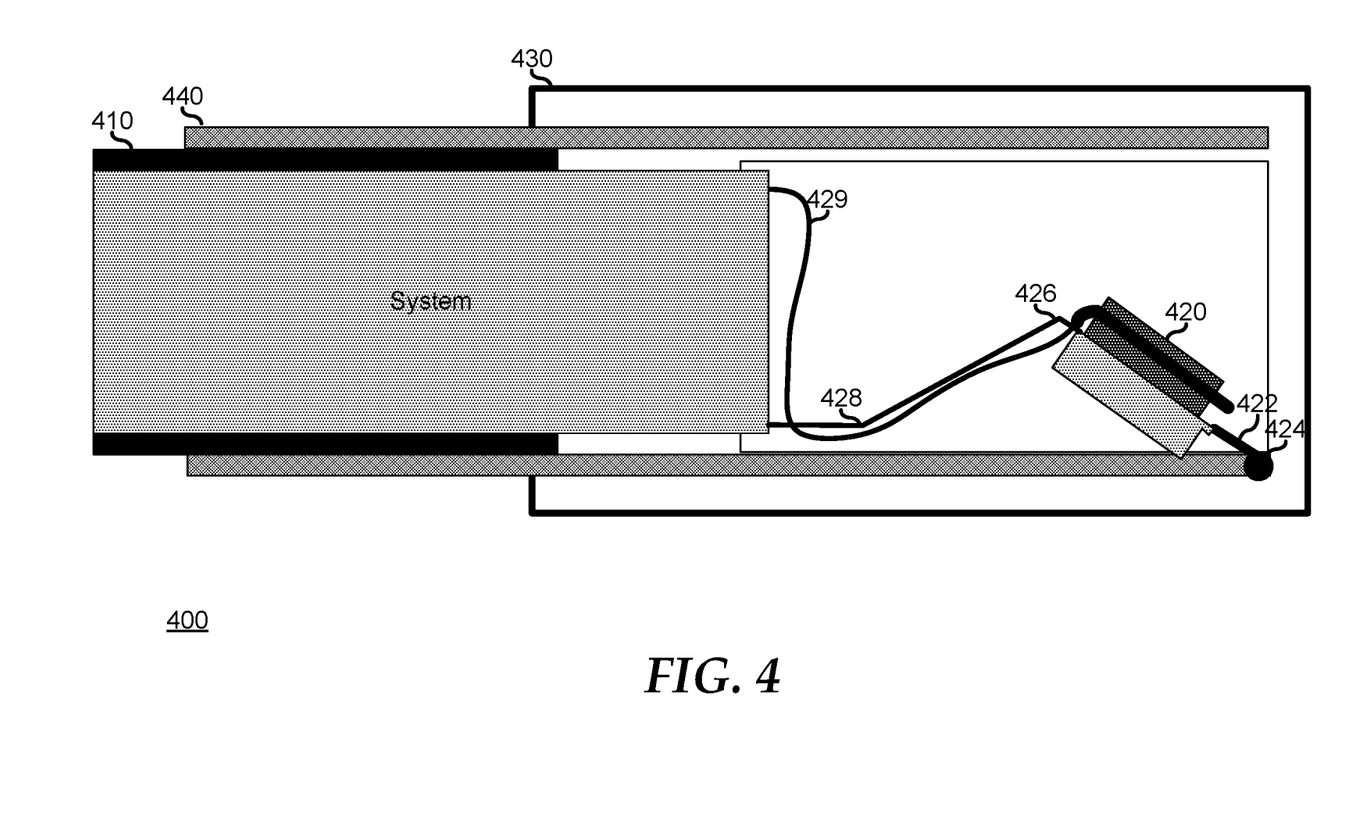
FIG. 4 is a top view of an information handling system according to another embodiment of the present disclosure.

FIG. 4 illustrates an installation 400, where an information handling system 410 is installed into a server rack 430 by affixing the information handling system to slides 440 and sliding the information handling system into the server rack. A liquid cooling heat exchanger module 420, similar to heat exchanger module 120, is configured to be attached to a hinge 424 that is affixed to server rack 430 via a mounting bracket 422. Information handling system 410 is connected to heat exchanger module 420 via coolant lines 429 in a flexible way such that as the information handling system is slid into server rack 430, the heat exchanger module is pushed by an articulating arm that manages the coolant lines and pivots around hinge 424 and pivot points 426 and 428, to rotate into a position behind the information handling system that is similar to the position of heat exchanger module 120 in the back of information handling system 100, as shown in FIG. 1. Similarly, as information handling system 410 is slid out of server rack 430, the heat exchanger module is pulled by the articulating arm that manages coolant lines 429 and pivots around hinge 424 and pivot points 426 and 428, to rotate out of the position behind the information handling system. In this way, a server rack can be pre-installed with one or more heat exchanger modules that can be connected to the associated information handling systems as they are installed into the server rack. Here, coolant lines 429 can be connected via quick-disconnect connections located at the rear of information handling system 210, so that the coolant lines can be disconnected or reconnected as needed to remove or install the information handling system. This configuration may make maintenance and repair of the associated information handling systems easier, without any necessity to manage the heat exchanger modules. Likewise, the maintenance and repair of the heat exchanger modules may thus be simplified.

Figure 5:
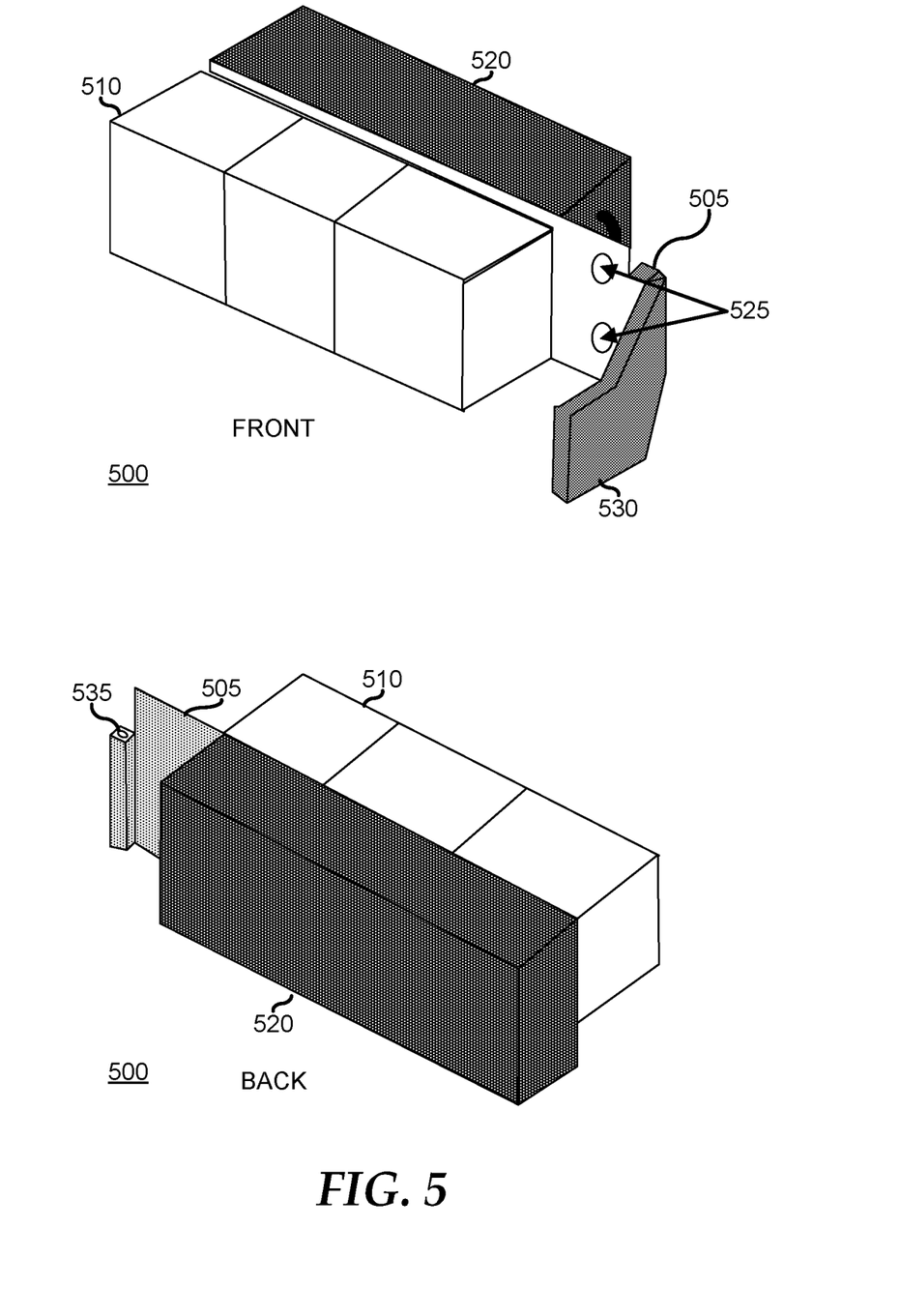
FIG. 5 illustrates front and back perspective views of the heat exchanger module of FIG. 4.

FIG. 5 illustrates front and back views of heat exchanger module 420. Heat exchanger module 420 includes a mounting arm 505 to which is affixed one or more fans 510 and a heat exchanger 520. Heat exchanger 520 is configured to provide coolant line couplers 525, to which are attached the coolant lines to an information handling system or processing system. Mounting arm 505 is attached to a mounting latch 530 via a hinge 535. Mounting latch 530 is rigidly attached to a rear of a server rack, or to a mounting rail of information handling system 410, for example via a buckling mechanism, such as may be used for mounting cable management arms to server racks.

Figure 6:
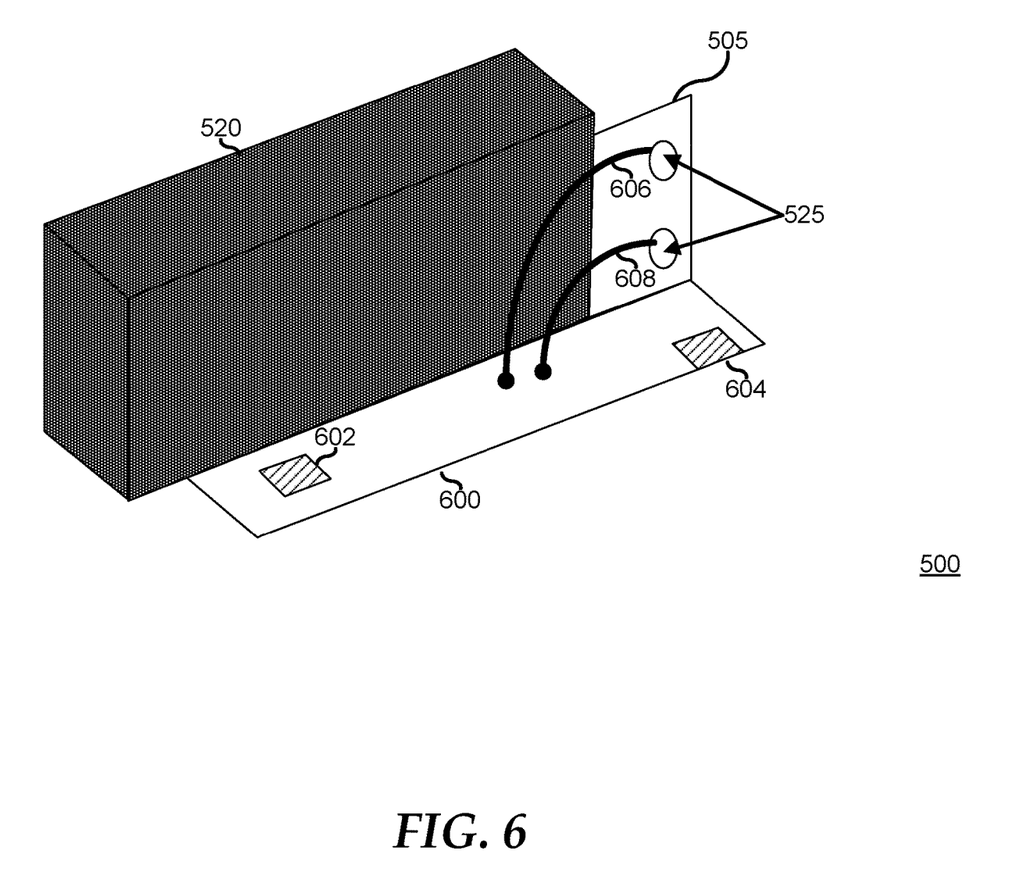
FIG. 6 is another front perspective view of the heat exchanger module of FIG. 5.

FIG. 6 illustrates a front view of heat exchanger module 420 with cooling fans 510 removed to expose a printed circuit board (PCB) 600 that is affixed to mounting arm 505. PCB 600 includes a fan connector 602 associated with each fan 510, and a power connector 604. PCP 600 this provides a mechanical mounting mechanism for fans 510, and for coupling power from power connector 604 to the fans via fan connectors 602. PCB 600 further includes an input coolant temperature sensor 606 and an output coolant temperature sensor 608. PCB 600 may also include air temperature sensors, as needed or desired, to determine the ambient air temperature being blown over heat exchanger 520. In a particular embodiment, PCB 600 includes circuitry to provide power, telemetry, and control signals from power/control connector 604. The circuitry operates to monitor the input and output coolant temperatures via temperature sensors 606 and 608, and to control the fan speed of fans 510 based upon the coolant temperatures. Here, power connector may be configured as a two-wire power connector with a voltage contact and a ground contact, and the circuitry may operate autonomously to control the fan speeds. An example of circuitry for controlling the fan speeds may include an embedded processor, a programmable logic device, a hardware analog control circuit, or the like, as needed to maintain the output coolant temperature at a desired temperature. In another embodiment, power connector 604 provides contacts for temperature sensors 606 and 608 to circuitry on the information handling system or processing system as needed or desired, and the circuitry operates to provide a control signal, such as a pulse width modulated (PWM) signal to the power connector to control the fan speeds of fans 510. An example of circuitry on an information handling system or processing system may include a baseboard management controller, an Integrated Dell Remote Access Controller (iDRAC), or another controller, as needed or desired. Other functions for controlling heat exchanger module 420 may include valve control, coolant level detection and warning, coolant pump operation and warning, leak detection and warning, and the like, as needed or desired.

Figure 7:
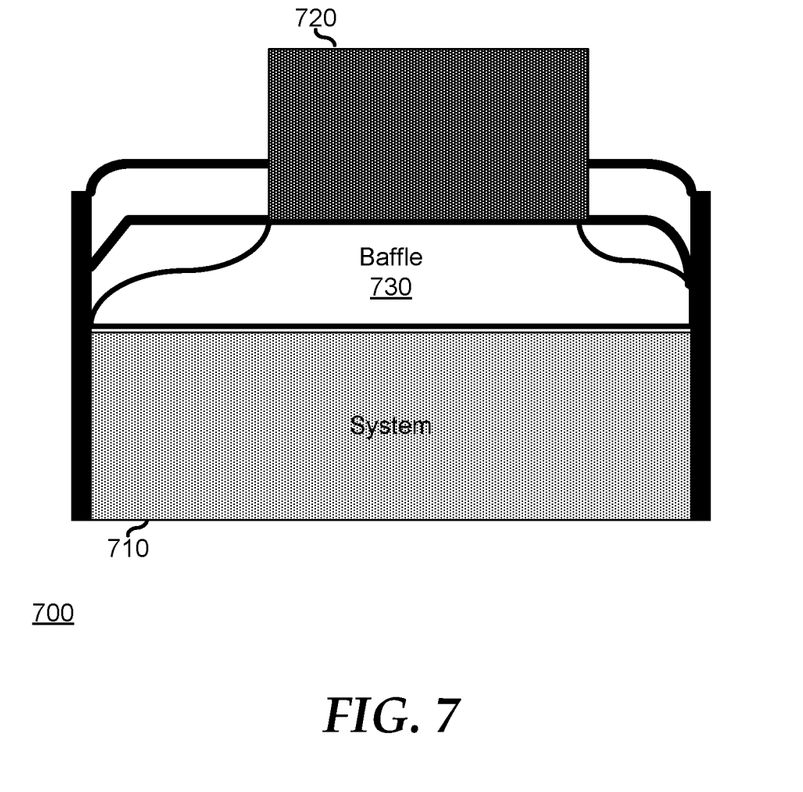
FIG. 7 is a top view of an information handling system according to another embodiment of the present disclosure.

FIG. 7 illustrates an information handling system 700, including a processing system 710, a liquid cooling heat exchanger module 720, and a baffle 730. Here, baffle 730 operates to direct cooling air from processing system 710 to the fans and heat exchanger of heat exchanger module 720. In this way, a greater flow of air may be provided to heat exchanger module 720, and the associated fans may represent an element of an overall air handling design for processing system 710. This also may be favorable in some environments where the ambient temperature at rear of processing system 710 rack environment is higher temp than expected, or is poorly controlled. This embodiment is provided in contrast to the embodiment shown in FIG. 1, where there is no associated baffle. In the case of the embodiment of FIG. 1, there may be no necessary coupling of the air flow through processing system 110, and the air flow through heat exchanger module 120, as is the case in the embodiment shown in FIG. 7.

It will be understood that, in any one of the above embodiments, the embodied liquid cooling systems may represent a Direct Contact Liquid Cooling (DCLC) system, as needed or desired. Further, while not shown, it will be understood that the embodied liquid cooling systems may include a pump to move the coolant through the liquid cooling circuit, and that such a pump may be located on the associated heat exchanger module, on the associated cold plates, or elsewhere in the information handling system, as needed or desired. It will be further understood that embodied liquid cooling systems may include a coolant reservoir, and that such a coolant reservoir may be located on the associated heat exchanger module, on the associated cold plates, or elsewhere in the information handling system, as needed or desired. It will be understood that the mounting of a heat exchanger module to a server rack may utilize existing mounting locations for, e.g., a cable management arm, or other device at the back of the server rack, as needed or desired. It will be further understood that the circuitry to control the fan speeds on a heat exchanger module may also monitor, manage, and maintain other functions, as needed or desired, such as fan power, pump power, heat exchanger module health, leak detection, reservoir detection, air inlet and outlet temperatures, and the like.

Figure 8:
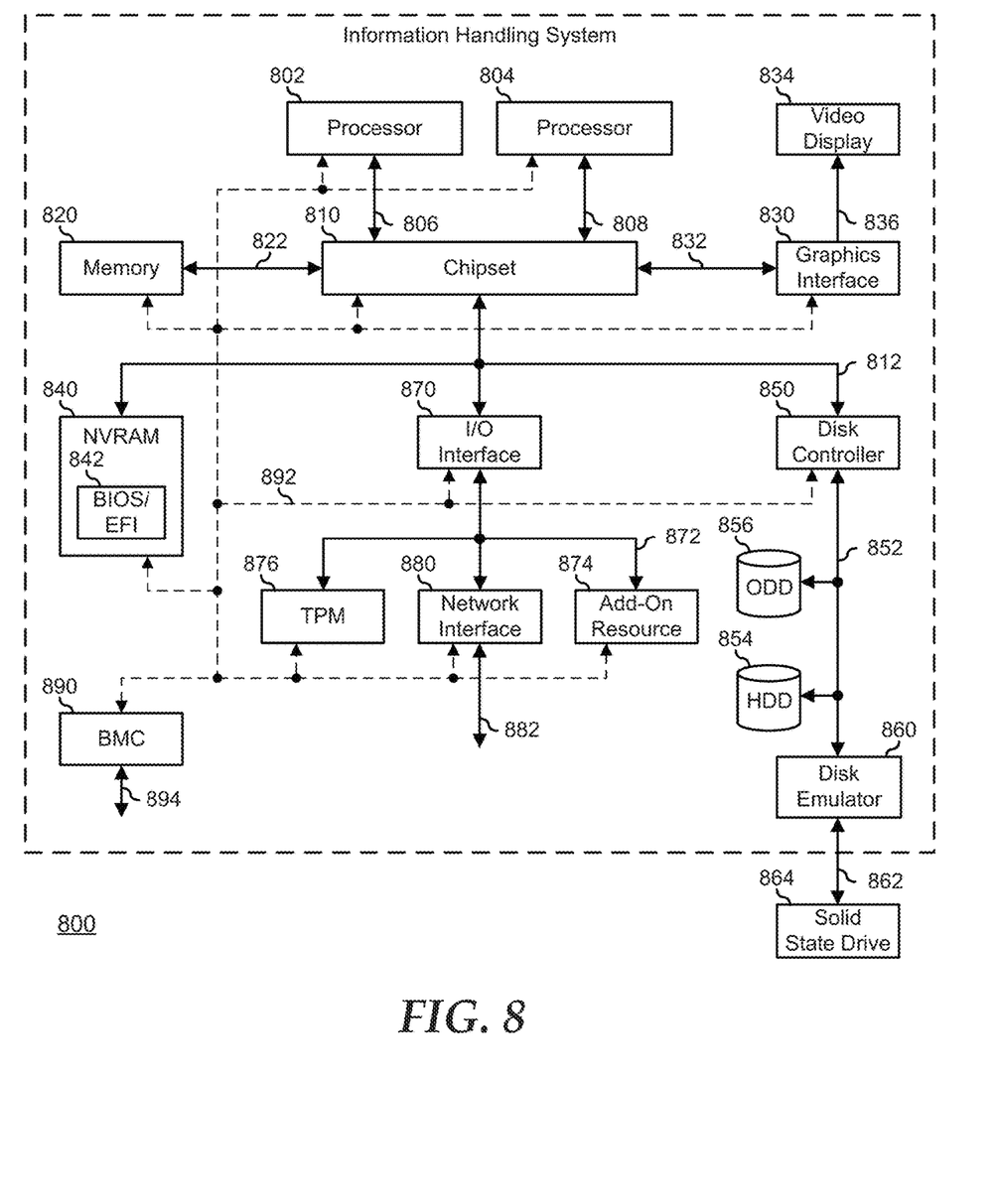
FIG. 8 is a block diagram of a general information handling system according to at least one embodiment of the disclosure.

FIG. 8 illustrates a generalized embodiment of information handling system 800. For purpose of this disclosure information handling system 800 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 includes processors 802 and 804, a chipset 810, a memory 820, a graphics adapter 830 connected to a video display 834, a non-volatile RAM (NV-RAM) 840 that includes a basic input and output system/extensible firmware interface (BIOS/EFI) module 842, a disk controller 850, a hard disk drive (HDD) 854, an optical disk drive 856, a disk emulator 860 connected to a solid state drive (SSD) 864, an input/output (I/O) interface 870 connected to an add-on resource 874 and a trusted platform module (TPM 876, a network interface 880, and a baseboard management controller (BMC) 890. Processor 802 is connected to chipset 810 via processor interface 806, and processor 804 is connected to the chipset via processor interface 808. In a particular embodiment, processors 802 and 804 are connected together via a high-capacity coherent fabric, such as a HyperTransport link, a QuickPath Interconnect, or the like. Chipset 810 represents an integrated circuit or group of integrated circuits that manages the data flows between processors 802 and 804 and the other elements of information handling system 800. In a particular embodiment, chipset 810 represents a pair of integrated circuits, such as a northbridge component and a southbridge component. In another embodiment, some or all of the functions and features of chipset 810 are integrated with one or more of processors 802 and 804. Memory 820 is connected to chipset 810 via a memory interface 822. An example of memory interface 822 includes a Double Data Rate (DDR) memory channel and memory 820 represents one or more DDR Dual In-Line Memory Modules (DIMMs). In a particular embodiment, memory interface 822 represents two or more DDR channels. In another embodiment, one or more of processors 802 and 804 include a memory interface that provides a dedicated memory for the processors. A DDR channel and the connected DDR DIMMs can be in accordance with a particular DDR standard, such as a DDR3 standard, a DDR4 standard, a DDR5 standard, or the like. Memory 820 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 830 is connected to chipset 810 via a graphics interface 832, and provides a video display output 836 to a video display 834. An example of a graphics interface 832 includes a Peripheral Component Interconnect-Express (PCIe) interface and graphics adapter 830 can include a four lane (x4) PCIe adapter, an eight lane (x8) PCIe adapter, a 16-lane (x16) PCIe adapter, or another configuration, as needed or desired. In a particular embodiment, graphics adapter 830 is provided down on a system printed circuit board (PCB). Video display output 836 can include a Digital Video Interface (DVI), a High-Definition Multimedia Interface (HDMI), a DisplayPort interface, or the like, and video display 834 can include a monitor, a smart television, an embedded display such as a laptop computer display, or the like.

NV-RAM 840, disk controller 850, and I/O interface 870 are connected to chipset 810 via an I/O channel 812. An example of I/O channel 812 includes one or more point-to-point PCIe links between chipset 810 and each of NV-RAM 840, disk controller 850, and I/O interface 870. Chipset 810 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. NV-RAM 840 includes BIOS/EFI module 842 that stores machine-executable code (BIOS/EFI code) that operates to detect the resources of information handling system 800, to provide drivers for the resources, to initialize the resources, and to provide common access mechanisms for the resources. The functions and features of BIOS/EFI module 842 will be further described below.

Disk controller 850 includes a disk interface 852 that connects the disc controller to a hard disk drive (HDD) 854, to an optical disk drive (ODD) 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits a solid-state drive (SSD) 864 to be connected to information handling system 800 via an external interface 862. An example of external interface 862 includes a USB interface, a proprietary interface, or a combination thereof. Alternatively, solid-state drive 864 can be disposed within information handling system 800.

I/O interface 870 includes a peripheral interface 872 that connects the I/O interface to add-on resource 874, to TPM 876, and to network interface 880. Peripheral interface 872 can be the same type of interface as I/O channel 812, or can be a different type of interface. As such, I/O interface 870 extends the capacity of I/O channel 812 when peripheral interface 872 and the I/O channel are of the same type, and the I/O interface translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a network communication device disposed within information handling system 800, on a main circuit board of the information handling system, integrated onto another component such as chipset 810, in another suitable location, or a combination thereof. Network interface device 880 includes a network channel 882 that provides an interface to devices that are external to information handling system 800. In a particular embodiment, network channel 882 is of a different type than peripheral channel 872 and network interface 880 translates information from a format suitable to the peripheral channel to a format suitable to external devices. In a particular embodiment, network interface 880 includes a network interface card (NIC) or host bus adapter (HBA), and an example of network channel 882 includes an InfiniBand channel, a Fibre Channel, a Gigabit Ethernet channel, a proprietary channel architecture, or a combination thereof. In another embodiment, network interface 880 includes a wireless communication interface, and network channel 882 includes a WiFi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 882 can be connected to an external network resource (not illustrated). The network resource can include another information handling system, a data storage system, another network, a grid management system, another suitable resource, or a combination thereof.

BMC 890 is connected to multiple elements of information handling system 800 via one or more management interface 892 to provide out of band monitoring, maintenance, and control of the elements of the information handling system. As such, BMC 890 represents a processing device different from processor 802 and processor 804, which provides various management functions for information handling system 800. For example, BMC 890 may be responsible for power management, cooling management, and the like. The term baseboard management controller (BMC) is often used in the context of server systems, while in a consumer-level device a BMC may be referred to as an embedded controller (EC). A BMC included at a data storage system can be referred to as a storage enclosure processor.

A BMC included at a chassis of a blade server can be referred to as a chassis management controller and embedded controllers included at the blades of the blade server can be referred to as blade management controllers.

Capabilities and functions provided by BMC 890 can vary considerably based on the type of information handling system. BMC 890 can operate in accordance with an Intelligent Platform Management Interface (IPMI). Examples of BMC 890 include an Integrated Dell Remote Access Controller (iDRAC). Management interface 892 represents one or more out-of-band communication interfaces between BMC 890 and the elements of information handling system 800, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 800, that is apart from the execution of code by processors 802 and 804 and procedures that are implemented on the information handling system in response to the executed code. BMC 890 operates to monitor and maintain system firmware, such as code stored in BIOS/EFI module 842, option ROMs for graphics interface 830, disk controller 850, add-on resource 874, network interface 880, or other elements of information handling system 800, as needed or desired. In particular, BMC 890 includes a network interface 894 that can be connected to a remote management system to receive firmware updates, as needed or desired. Here, BMC 890 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 890 utilizes various protocols and application programming interfaces (APIs) to direct and control the processes for monitoring and maintaining the system firmware. An example of a protocol or API for monitoring and maintaining the system firmware includes a graphical user interface (GUI) GUI associated with BMC 890, an interface defined by the Distributed Management Taskforce (DMTF) (such as a Web Services Management (WS-MAN) interface, a Management Component Transport Protocol (MCTP) or, a Redfish interface), various vendor defined interfaces (such as a Dell EMC Remote Access Controller Administrator (RACADM) utility, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 890 is included on a main circuit board (such as a baseboard, a motherboard, or any combination thereof) of information handling system 800, or is integrated onto another element of the information handling system such as chipset 810, or another suitable element, as needed or desired. As such, BMC 890 can be part of an integrated circuit or a chip set within information handling system 800. An example of BMC 890 includes an integrated Dell remote access controller (iDRAC), or the like. BMC 890 may operate on a separate power plane from other resources in information handling system 800. Thus BMC 890 can communicate with the management system via network interface 894 while the resources of information handling system 800 are powered off. Here, information can be sent from the management system to BMC 890 and the information can be stored in a RAM or NV-RAM associated with the BMC. Information stored in the RAM may be lost after power-down of the power plane for BMC 890, while information stored in the NV-RAM may be saved through a power-down/power-up cycle of the power plane for the BMC.

The term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:
a server rack including a plurality of rack units for receiving equipment;
a processing system configured to be installed into at least one of the rack units, the processing system including a component configured to be cooled by a liquid cooling cold plate; and
a liquid cooling heat exchanger module affixed within a same rack unit as the processing system, and configured to provide chilled cooling liquid to cool the cold plate, and to no other equipment in the server rack, wherein when the processing system is removed from the server rack, the liquid cooling heat exchanger module pivots at a point where the liquid cooling heat exchanger module is affixed to the server rack, to permit flexible coolant lines to remain coupled to the liquid cooling heat exchanger module.

2. The information handling system of claim 1, wherein the liquid cooling heat exchanger module is affixed to the server rack and the cold plate is coupled to the liquid cooling heat exchanger module via the flexible coolant lines.

3. The information handling system of claim 2, wherein the processing system is coupled to a plurality of cables for conducting signals and power to the processing system.

4. The information handling system of claim 3, wherein when the processing system is removed from the server rack and the liquid cooling heat exchanger module pivots, and an articulating arm further permits the cables to remain coupled to the processing system.

5. The information handling system of claim 1, wherein the liquid cooling heat exchanger module is affixed to the processing system.

6. The information handling system of claim 1, wherein the liquid cooling heat exchanger module includes:
a heat exchanger to chill the cooling liquid circulated to the cold plate;
a fan to blow air over the heat exchanger to chill the heat exchanger; and
a temperature sensor to sense a temperature of the cooling liquid.

7. The information handling system of claim 6, wherein a fan speed of the fan is controlled by a processor of the liquid cooling heat exchanger module based upon a temperature received from the temperature sensor.

8. The information handling system of claim 6, wherein a fan speed is controlled by the processing system based upon a temperature received from the temperature sensor.

9. The information handling system of claim 1, further comprising:
a baffle to receive the air from the processing system, and to channel air to the fan.

10. A method, comprising:
installing, into a server rack including a plurality of rack units for receiving equipment, a processing system into at least one of the rack units, the processing system including a component configured to be cooled by a liquid cooling cold plate;
affixing, within a same rack unit as the processing system, a liquid cooling heat exchanger module to provide chilled cooling liquid to cool the cold plate, and to no other equipment in the server rack; and
extending, from the server rack, the processing system, wherein when the processing system is extended from the server rack, the liquid cooling heat exchanger module pivots at a point where the liquid cooling heat exchanger module is affixed to the server rack, to permit flexible coolant lines to remain coupled to the liquid cooling heat exchanger module and the processing system.

11. The method of claim 10, wherein:
the liquid cooling heat exchanger module is affixed to the server rack; and
the method further comprises, coupling the cold plate to the liquid cooling heat exchanger module via the flexible coolant lines.

12. The method of claim 11, further comprising:
coupling a plurality of cables for conducting signals and power to the processing system.

13. The method of claim 12, wherein when the processing system is removed from the server rack and the liquid cooling heat exchanger module pivots, and an articulating arm further permits the cables to remain coupled to the processing system.

14. The method of claim 10, wherein the liquid cooling heat exchanger module is affixed to the processing system.

15. The method of claim 10, further comprising:
circulating the cooling liquid from the cold plate to a heat exchanger of the liquid cooling heat exchanger module to chill the cooling liquid circulated to the cold plate;
blowing, by a fan of the liquid cooling heat exchanger module, air over the heat exchanger to chill the heat exchanger; and
determining, by a temperature sensor of the liquid cooling heat exchanger module, a temperature of the cooling liquid.

16. The method of claim 15, wherein a fan speed of the fan is controlled based upon the temperature.

17. The method of claim 15, further comprising:
receiving, at a baffle, the air from the processing system; and
channeling, by the baffle, the air to the fan.

18. An information handling system, comprising:
a server rack including a plurality of rack units for receiving equipment;
a first processing system configured to be installed into a first one of the rack units, the first processing system including a first component configured to be cooled by a first liquid cooling cold plate;
a first liquid cooling heat exchanger module affixed within the first rack unit, and configured to provide chilled cooling liquid to chill only the first cold plate, wherein when the first processing system is removed from the server rack, the first liquid cooling heat exchanger module pivots at a point where the first liquid cooling heat exchanger module is affixed to the server rack, to permit flexible coolant lines to remain coupled to the first liquid cooling heat exchanger module;

a second processing system configured to be installed into a second one of the rack units, the second processing system including a second component configured to be cooled by a second liquid cooling cold plate;
a second liquid cooling heat exchanger module affixed within the second rack unit, and configured to provide cold cooling liquid to chill only the second cold plate.

* * * * *